United States Patent [19]
Takeuchi et al.

[11] Patent Number: 5,239,188
[45] Date of Patent: Aug. 24, 1993

[54] GALLIUM NITRIDE BASE SEMICONDUCTOR DEVICE

[75] Inventors: Tetsuya Takeuchi, Nagoya; Hiroshi Amano, Nijigaokahigashidanchi Room No. 19-103, No. 21, Kamioka-cho 2-chome, Meito-ku, Nagoya-shi, Aichi-ken; Isamu Akasaki, No. 1-38-805, Jyoshin 1-chome, Nishi-ku, Nagoya-shi, Aichi-ken; Atsushi Watanabe, Tsurugashima; Katsuhide Manabe, Inazawa, all of Japan

[73] Assignees: Hiroshi Amano; Isamu Akasaki, both of Aichi; Pioneer Electronic Corporation, Tokyo; Toyoda Gosei Co., Ltd., Aichi, all of Japan

[21] Appl. No.: 971,208

[22] Filed: Nov. 4, 1992

[30] Foreign Application Priority Data

Dec. 18, 1991 [JP] Japan .................. 3-335255

[51] Int. Cl.$^5$ ........................... H01L 27/14
[52] U.S. Cl. ........................... 257/76; 257/78; 257/431; 257/200; 257/201
[58] Field of Search .............. 257/76, 78, 200, 201, 257/183, 431

[56] References Cited

U.S. PATENT DOCUMENTS

| | | | |
|---|---|---|---|
| 4,855,249 | 8/1989 | Akasaki et al. | 437/81 |
| 4,903,088 | 2/1990 | Van Opdorp | 257/76 |
| 4,911,102 | 3/1990 | Manabe et al. | 118/719 |
| 5,122,845 | 6/1992 | Manabe et al. | 357/17 |
| 5,173,751 | 12/1992 | Ota et al. | 257/78 X |
| 5,182,670 | 1/1993 | Khan et al. | 257/76 X |

FOREIGN PATENT DOCUMENTS 0430562 6/1991 European Pat. Off. ............ 257/201

OTHER PUBLICATIONS

Chu, "Gallium Nitride Films," *Journal of Electrochemical Society: Solid State Science*, vol. 118, No. 7, Jul. 1971, pp. 1200–1203.

Morimoto et al., "Vapor Phase Epitaxial Growth of GaN on GaAs, GaP, Si, and Sapphire Substrates from GaBr$_3$ and NH$_3$," *Journal of Electrochemical Society: Solid State Science*, vol. 120, No. 12, pp. 1783–1785.

*Primary Examiner*—William Mintel
*Attorney, Agent, or Firm*—Sughrue, Mion, Zinn, Macpeak & Seas

[57] ABSTRACT

Disclosed are a gallium nitride type semiconductor device that has a single crystal of $(Ga_{1-x}Al_x)_{1-y}In_yN$, which suppresses the occurrence of crystal defects and thus has very high crystallization and considerably excellent flatness, and a method of fabricating the same. The gallium nitride type semiconductor device comprises a silicon substrate, an intermediate layer consisting of a compound containing at least aluminum and nitrogen and formed on the silicon substrate, and a crystal layer of $(Ga_{1-x}Al_x)_{1-y}In_yN$ ($0 \leq x \leq 1$, $0 \leq y \leq 1$, excluding the case of $x=1$ and $y=0$). According to the method of fabricating a gallium nitride base semiconductor device, a silicon single crystal substrate is kept at a temperature of 400 to 1300° C. and is held in the atmosphere where a metaloganic compound containing at least aluminum and a nitrogen-containing compound are present to form a thin intermediate layer containing at least aluminum and nitrogen on a part or the entirety of the surface of the single crystal substrate, and then at least one layer or multiple layers of a single crystal of $(Ga_{1-x}Al_x)_{1-y}In_yN$ are formed on the intermediate layer.

2 Claims, 9 Drawing Sheets

FORMING AlN INTERMEDIATE LAYER

*Fig. 2B*

SEPARATING SiO₂

*Fig. 2C*

GROWING GaN

FORMING AlN INTERMEDIATE LAYER

AlN INTERMEDIATE LAYER: 2

Fig. 4B

SEPARATING SiO₂

Fig. 4C

GROWING GaN

Fig. 4D

GROWING GaN

FORMING Al$_x$Ga$_{1-x}$N INTERMEDIATE LAYER ( X > 0.1 )

Fig. 6B

PREPARING GaN SINGLE CRYSTAL

FORMING AℓN INTERMEDIATE LAYER
(10nm OR BELOW IN THICKNESS)

Fig. 8B

PREPARING GaN SINGLE CRYSTAL

GALLIUM NITRIDE BASE SEMICONDUCTOR DEVICE

BACKGROUND OF THE INVENTION

1. Field of the Invention

The present invention generally relates to a gallium nitride (GaN) type semiconductor device comprising a $(Ga_{1-x}Al_x)_{1-y}In_yN$ single crystal, which has been receiving growing attention as a wide gap semiconductor in the industry, and a method of fabricating the same. More particularly, this invention is directed to a method of forming on a silicon (Si) substrate a high-quality $(Ga_{1-x}Al_x)_{1-y}In_yN$ single crystal, which is expected to be a material for a device for emitting or detecting light with a wavelength of 200 to 700 nm.

2. Description of the Related Art

A $(Ga_{1-x}Al_x)_{1-y}In_yN$ crystal ($0 \leq x \leq 1$, $0 \leq y = 1$, excluding the case of $x=1$ and $y=0$) is a direct transient semiconductor with a light wavelength of 200 to 700 nm to the energy band gap at the room temperature, and is expected as a material particularly for a device which emits and receives light having a wavelength of a visible short wavelength range or an ultraviolet range.

Since the $(Ga_{1-x}Al_x)_{1-y}In_yN$ crystal contains nitrogen (N) whose equilibrium vapor pressure is very high near the growth temperature, its bulk crystal cannot be easily produced. At present, therefore, the single crystal is produced through a hetero epitaxial growth where different crystals are used as a substrate.

As the essential requirements for a substrate for producing the $(Ga_{1-x}Al_x)_{1-y}In_yN$ crystal, it is desirable that the substrate have the following characteristics:

(1) High melting point (at least 1,000° C.)
(2) Chemically stable
(3) Excellent crystal quality
(4) Small difference in lattice constant
(5) Easy to obtain.
(6) Large in size In addition, in the case of fabricating a device which electrically functions:

(7) it is desirable that the electric characteristics be easily controlled; particularly, a low resistance is desirable.

No crystals which satisfy all of those conditions have been found yet. The substrate which is most frequently used at present is formed of sapphire that satisfies the conditions (1), (2), (3), (5) and (6).

Since the difference between the lattice constant of sapphire and that of $(Ga_{1-x}Al_x)_{1-y}In_yN$ is 11% or more, however, sapphire is not desirable in view of the condition (4). In addition, because sapphire is an insulating material and is rigid, it is not easy to form a gallium nitride type semiconductor device, particularly, its electrode, it is not suitable for a semiconductor device that operates on a large current supplied.

Silicon (Si) is one of proposed substrate materials to overcome this shortcoming. By using Si, a preferable substrate is obtained with a low resistance and high melting point and having a large and substantially perfect crystal. A Si substrate is inexpensive and has a high crystal quality, and large crystallinity. The fine working of the Si substrate are easily accomplished. That is, Si fulfills the conditions (1), (2), (3), (5), (6) and (7). The biggest issue in yielding a $(Ga_{1-x}Al_x)_{1-y}In_yN$ crystal on a Si substrate is that there is a large difference in lattice constant of about 17% between GaN and Si, and thus there is a demand for establishment of the technology to suppress the occurrence of crystal defects due to this difference in lattice constant.

SUMMARY OF THE INVENTION

It is therefore an object of the present invention to provide a gallium nitride type semiconductor device that permits a $(Ga_{1-x}Al_x)_{1-y}In_yN$ crystal, which is expected as a material for a device which emits and receives light having a wavelength of a visible short wavelength range or an ultraviolet range, to be formed on a Si substrate, of inexpensive having the above mentioned advantages e.g. high crystal quality, large sign wafer, low cost and well-controlled electrical conductivety.

The present invention is characterized by fabricating a gallium nitride type semiconductor device using a method including a step of, in forming a $(Ga_{1-x}Al_x)_{1-y}In_yN$ single crystal on a Si substrate, introducing a metalorganic compound containing at least aluminum (Al) and a nitrogen compound into a reactor before growing the $(Ga_{1-x}Al_x)_{1-y}In_yN$ single crystal to form a compound containing at least Al and N, e.g., an AlN thin layer, on a part or entirety of the surface of the Si substrate, then temporarily stopping only the supply of the Al-containing organic metal compound, subsequently supplying metalorganic compounds with necessary amounts of Al, Ga and In corresponding to a desired composition of a mixed crystal, thereby forming a $(Ga_{1-x}Al_x)_{1-y}In_yN$ ($0 \leq x \leq 1$, $0 \leq y = 1$, excluding the case of $x=1$ and $y=0$) on the thin layer of a compound containing Al and N, i.e., on an intermediate layer.

According to a preferred embodiment of the present invention, it is preferable that the temperature of the Si substrate be within a range of 400 to 1300° C. in the case where an Al-containing organic metal compound and a nitrogen compound are introduced into a reactor to form a compound containing at least Al and N, e.g., AlN (hereinafter such a compound is referred to as AlN).

It is to be noted that the present invention is effective in the case where the AlN molar fraction x of the above mentioned $(Ga_{1-x}Al_x)_{1-y}In_yN$ layer ranges from 0 to 1, both 0 and 1 inclusive, and the InN molar fraction y ranges from 0 to 1, both 0 and 1 inclusive, excluding the case of $x=1$ and $y=0$.

The present inventors have completed the present invention based on the results of studies of various methods of treating the Si substrate surface to acquire a high-quality $(Ga_{1-x}Al_x)_{1-y}In_yN$ single crystal on a Si substrate whose electric characteristics are easily controlled and which has an excellent crystalline quality and is inexpensive, by vapor phase epitaxial method, particularly, by organic metal vapor phase epitaxy.

The biggest difficulty in growing a $(Ga_{1-x}Al_x)_{1-y}In_yN$ layer on a Si substrate is a large difference in lattice constant of about 17% between GaN and Si. Actually, even if GaN is allowed to grow directly on a Si substrate, it will be polycrystallized, or it will grow as an island shaped into hexagonal prisms even when it becomes a single crystal. This makes it difficult to yield a high-quality single crystal with good flatness. For instance, T. L. Chu, Journal of Electrochemical Society, Solid State Science, vol. 118, 1971, p. 1200, and Yasuo Morimoto, Kosuke Uchiho and Shintaro Ushio, Journal of Electrochemical Society, vol. 120, 1973, p. 1783 reported the cases of direct growth of GaN on a Si substrate, and the present inventors have re-examined the reports from various aspects only to find that direct growth of a high-quality crystal on a Si substrate is difficult. The present inventors then thought that an intermediate layer might be necessary and studied on various crystals, selecting 3C-SiC as the first candidate.

With 3C-SiC used as an intermediate layer, it has already been confirmed that a high-quality single crystal of $(Ga_{1-x}Al_x)_{1-y}In_yN$ can grow (see Japanese Unexamined Patent Publication No. 2-418003). The present inventors further considered that the similar effects could be expected by using AlN having almost the same lattice constant as 3C-SiC as an intermediate layer. Based on their findings, they made various studies to accomplish the present invention. It is apparent from Table 1 that the difference between the lattice constant of 3C-SiC and that of AlN is (0.94%) significantly smaller than those between $S_i$ and $3C-S_iC$ (19.74), and AlN and GaN (2.50).

TABLE 1

Lattice Constants of Si, SiC and Nitride and Differences in Lattice Constant

| | Lattice Constant (nm) | Lattice Constant Difference (%) |
|---|---|---|
| Si | 0.5430 | 19.74 |
| 3C-SiC | 0.4358 | 0.94 |
| AlN | 0.3111 | SiC(111)-AlN(0001) |
| GaN | 0.3189 | 2.50 |

The feature of the present invention lies in that AlN is used as an intermediate layer; the use of AlN as an intermediate layer to grow a $(Ga_{1-x}Al_x)_{1-y}In_yN$ layer on a Si substrate can yield a single crystal of $(Ga_{1-x}Al_x)_{1-y}In_yN$ with very high quality and considerably excellent flatness as compared with the one obtained by direct growth of GaN on a Si substrate.

The present invention can provide a single crystal of $(Ga_{1-x}Al_x)_{1-y}In_yN$ at a low cost. Further, this invention can provide availabilites for fine stractures and a high current injection, thereby obtaing a gallium nitride type semiconductor device, particularly, a semiconductor laser diode. The present inventors also found that depositing a thin AlN (about 50 nm in thickness) on a sapphire substrate at a low temperature (about 600° C.) as a buffer layer before growing a $(Ga_{1-x}Al_x)_{1-y}In_yN$ crystal can yield a high-quality $(Ga_{1-x}Al_x)_{1-y}In_yN$ crystal on the sapphire substrate (see Japanese Unexamined Patent Publication No. 60-256806). The present inventors have succeeded in preparing high-performance blue and ultraviolet LEDs using this technique.

DETAILED DESCRIPTION OF THE PREFERRED EMBODIMENT

A method of forming a single crystal of $(Ga_{1-x}Al_x)_{1-y}In_yN$ ($0 \leq x \leq 1$, $0 \leq y = 1$, excluding the case of x=1 and y=0) on a Si substrate according to a preferred embodiment of the present invention will now be described. It is to be noted that the embodiment and examples to be described below simply illustrates the invention, and the invention is not limited thereto.

Figure 1:
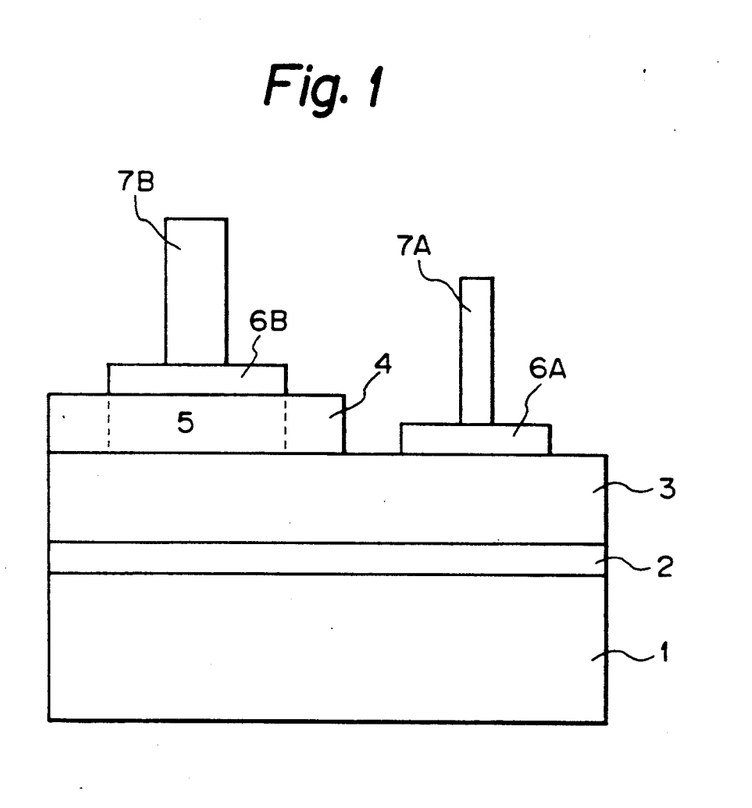
FIG. 1 is a schematic cross sectional view illustrating structure the of a light-emitting diode which is a gallium nitride type semiconductor device embodying the present invention and has $(Ga_{1-x}Al_x)_{1-y}In_yN$ ($0 \leq x \leq 1$, $0 \leq y = 1$, excluding the case of x=1 and y=0) formed on a Si substrate.

The embodiment employs a metaloganic compound vapor phase epitaxial method which is excellent in terms of mass production and control of film thickness, and facilitates particularly the fabrication of a light-emitting device. As illustrated in FIG. 1, after an AlN thin intermediate layer 2 is formed on an n type, low-resistance Si substrate wafer 1 having a (111) plane, an undoped or Si-doped n type GaN layer 3 is grown on the intermediate layer 2. Next, an Mg-doped GaN layer 4 is selectively grown on the surface of the resultant structure, and then the wafer is removed from a reactor and is subjected to low-energy electron-beam irradiation (Japanese Unexamined Patent Publication No. 2-2614) to partially transform the Mg-doped GaN layer 4 to a p type, forming a p type region 5. Then, metal electrodes 6A and 6B are vapor-deposited on the n type GaN layer 3 and the p type GaN region 5, respectively, and leads 7A and 7B are connected to the respective electrodes 6A and 6B, thus yielding a light-emitting diode. It was confirmed that when a bias was applied to the diode between the n type GaN layer 3 as the negative side and the Mg-doped p type GaN region 5 as the positive side, blue and ultraviolet lights were emitted at a voltage of around 3.5 V at the room temperature.

(1) Process for Forming Intermediate Layer

The AlN intermediate layer and a single crystal of $(Ga_{l-x}Al_x)_{l-y}In_yN$ ($0 \leq x \leq 1$, $0 \leq y = 1$, excluding the case of $x=1$ and $y=0$) were formed using the ordinary horizontal type compound semiconductor crystal growth apparatus. The growing procedures will be described below. First, after a crystal growing substrate, i.e., a low-resistance Si substrate (a (111) plane was used in the experiment) is cleaned with an organic solvent such as methanol, the oxide on the surface is removed by a hydrofluoric acid type etchant; and the resultant structure is rinsed with pure water and is then placed in a crystal growing section. After the furnace is evacuated, hydrogen is supplied there and the temperature is raised to, for example, about 1200° C. (in the range of 400 to 1300° C.). Since this growth apparatus uses quartz in the furnace, whose melting point is 1300° C., the experiment above that temperature is difficult and has not been conducted.

Hydrogen is added into the furnace thereafter, and an Al-containing organic metal compound, e.g., trimethyl aluminum (TMA), and a nitrogen compound such as ammonia (NH₃) are introduced into the growth apparatus, forming an AlN thin film about 5 to 200 nm in thickness on the Si substrate. When the substrate temperature at the time of forming the AlN thin film is lower than 400° C., the decomposition of the raw material gas is insufficient so that the advantages of the present invention cannot be expected. Due to the use of quartz in the furnace for convenience' sake on the apparatus side, no experiments is feasible above 1300° C. In addition, if the AlN buffer layer becomes thicker than 200 nm, the flatness of the $(Ga_{l-x}Al_x)_{l-y}In_yN$ layer which grows on the AlN layer becomes lower.

While the use of the AlN intermediate layer is effective in providing a high-quality GaN single crystal, for example, on the Si substrate, the substrate is electrically insulated from the GaN layer due to the high resistance of the AlN layer. The substrate cannot therefore be used as an electrode. There are many ways to overcome this problem, and four of them will be discussed below.

(i) Use of Selective Polycrystal Yielding Technique

Figure 2A:
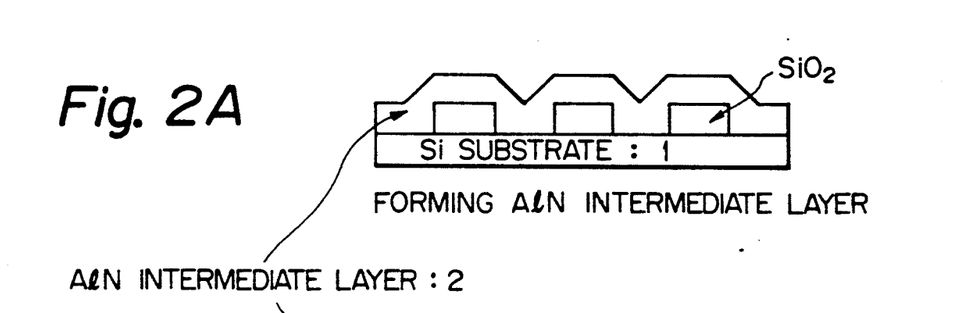
FIGS. 2A, 2B and 2C are schematic cross-sectional views showing individual layers on a Si substrate formed by a method of fabricating a gallium nitride type semiconductor device according to one example of the present invention.
Figure 2B:
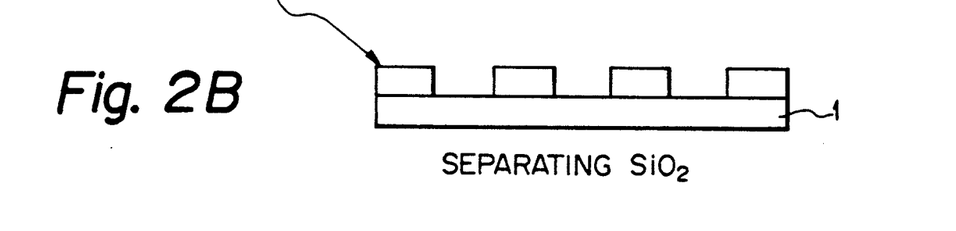
Figure 2C:
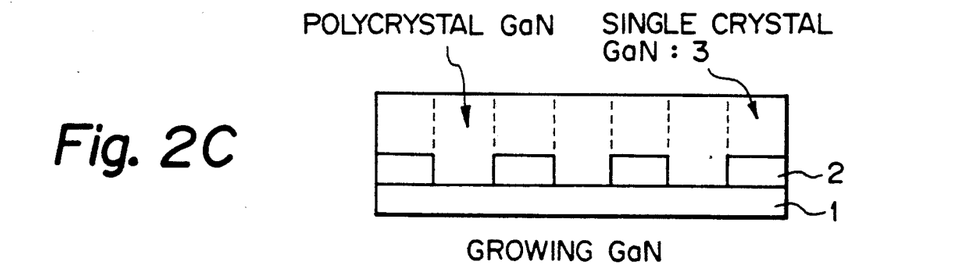
Figure 3:
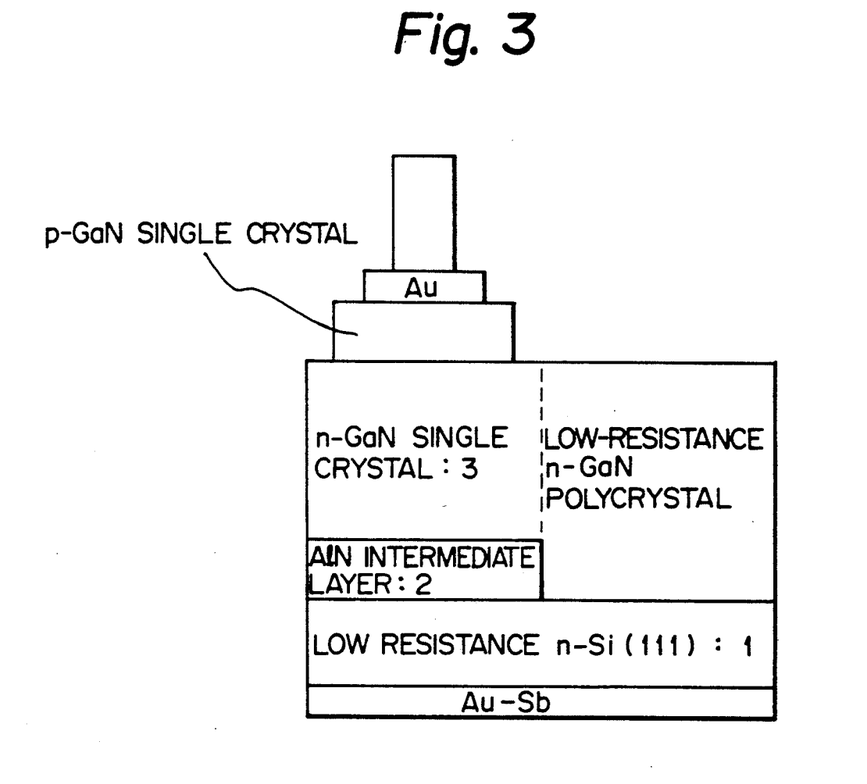
FIG. 3 is a schematic cross-sectional view illustrating the structure of a light-emitting diode as a gallium nitride type semiconductor device according to this example of the present invention.

As schematically illustrated in the growing process in FIG. 2, the AlN intermediate layer 2 is formed on the Si substrate 1 which is partially covered with SiO₂ (FIG. 2A), and the resultant structure is temporarily taken out of the furnace to separate SiO₂. Consequently, the surface of the Si substrate is divided into a portion covered with the AlN layer and a Si-substrate exposed portion (FIG. 2B). In this case, the AlN layer portion and the Si-substrate exposed portion are made to have about the same area. Then, GaN is grown on the resultant substrate. GaN is grown as a single crystal on the AlN intermediate layer 2, yielding a GaN polycrystal on the Si substrate 1. The GaN polycrystal on the Si substrate 1 shows a low-resistance n type conductivity and will not have a high resistance even when an acceptor impurity is added, so that the Si substrate and the GaN single crystal are electrically connected together via the GaN polycrystal (FIG. 2C). FIG. 3 illustrates the schematic structure of a light-emitting device fabricated by the selective polycrystal yielding technique. This light-emitting device comprises a Au-Sb electrode, a Si substrate, an AlN intermediate layer, an n type GaN single crystal layer connected via an n type GaN polycrystal layer to the Si substrate, a p type GaN single crystal layer and a Au electrode, laminated one on another in the named order.

(ii) Use of Selective Horizontal Processing Technique

Figure 4A:
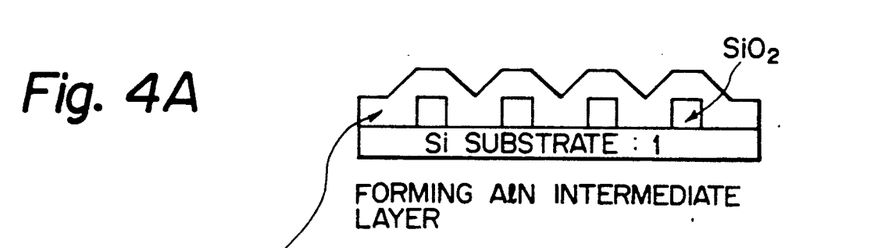
FIGS. 4A, 4B, 4C and 4D are schematic cross-sectional views showing individual layers on a Si substrate formed by a method of fabricating a gallium nitride type semiconductor device according to another example of the present invention.
Figure 4B:
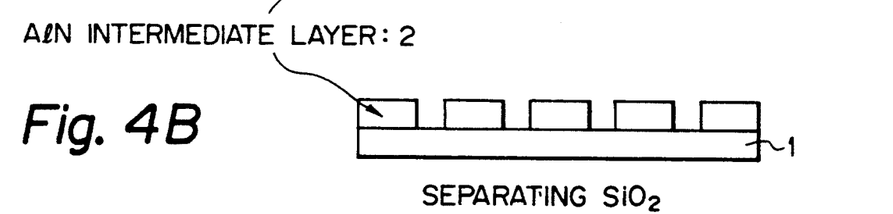
Figure 4C:
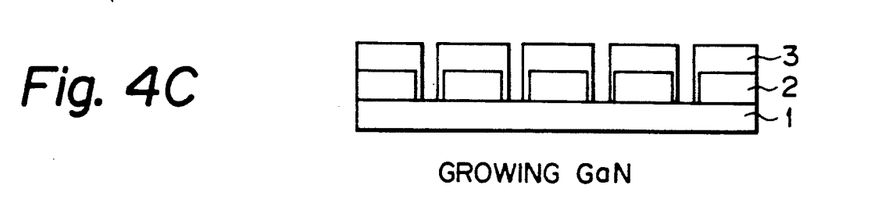
Figure 4D:
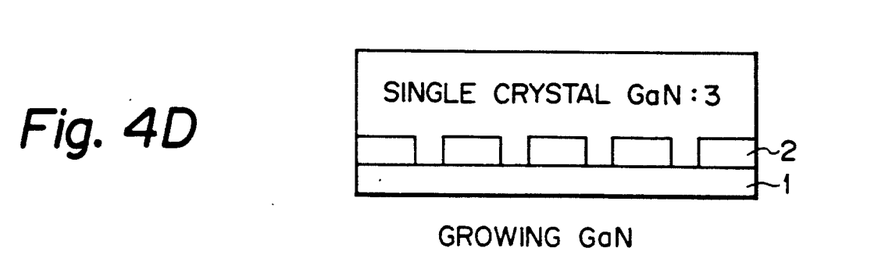
Figure 5:
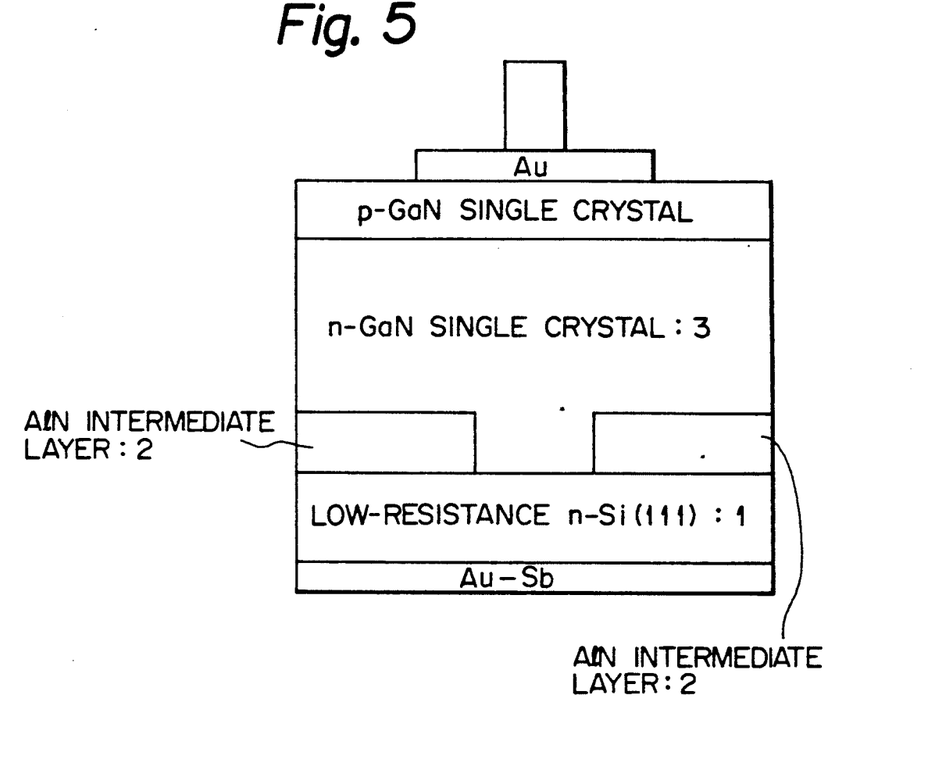
FIG. 5 is a schematic cross-sectional view illustrating the structure of a light-emitting diode as a gallium nitride type semiconductor device according to this example of the present invention.

As schematically illustrated in the growing process in FIGS. 4A, 4B, 4C and 4D, an AlN intermediate layer portion 2 and a Si-substrate exposed portion are formed on the surface of the Si substrate 1 using the same means (FIGS. 4A and 4B) as involved in the selective polycrystal yielding technique (1). In this case, the area of the AlN intermediate layer portion is made comparatively larger than that of the Si-substrate exposed portion. As a GaN single crystal is grown on the resultant substrate, the GaN single crystal is first grown only on the AlN intermediate layer portion (FIG. 4C). The GaN single crystal grown on the AlN intermediate layer then grows horizontally to be coupled to the GaN layer which has grown on the adjoining AlN intermediate layer, and finally, one GaN single crystal is yielded on the whole Si substrate 1 (FIG. 4D). The Si substrate and the GaN single crystal are electrically connected together at the horizontally-grown portion. FIG. 5 illustrates the schematic structure of a light-emitting device fabricated by the selective horizontal processing technique. This light-emitting device comprises a Au-Sb electrode, a Si substrate, an AlN intermediate layer, an n type GaN single crystal layer, a p type GaN single crystal layer and a Au electrode, laminated one on another in the named order.

(iii) Use of $Al_xGa_{l-x}N$ ($x \neq 1$) Intermediate Layer

Figure 6A:
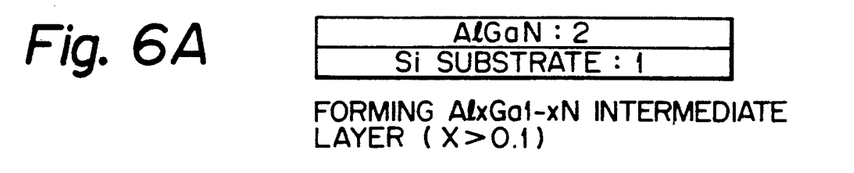
FIGS. 6A and 6B schematic cross-sectional views showing individual layers on a Si substrate formed by a method of fabricating a gallium nitride type base semiconductor device according to a further example of the present invention.
Figure 6B:
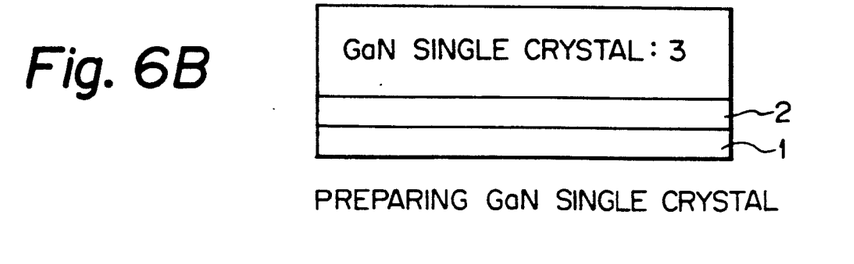
Figure 7:
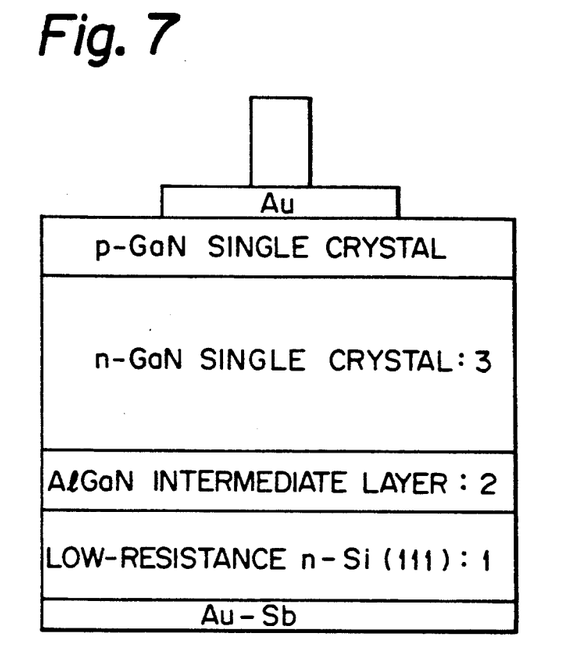
FIG. 7 is a schematic cross-sectional view illustrating the structure of a light-emitting diode as a gallium nitride type semiconductor device according to this embodiment of the present invention.

As schematically illustrated in the growing process in FIGS. 6A and 6B, instead of the AlN intermediate layer, an $Al_xGa_{l-x}N$ ($x \neq 1$) intermediate layer 2 is uniformly formed on the Si substrate 1 (FIG. 6A). As $Al_xGa_{l-x}N$ can be made to have a low resistance by the addition of a donor impurity, it can be electrically connected to the Si substrate 1. Actually, since Si acts as a donor in $Al_xGa_{l-x}N$ and is automatically doped from the substrate during growth, the $Al_xGa_{l-x}N$ intermediate layer 2 becomes a low-resistance n type even without intentionally adding an impurity, which is very convenient. With regard to the composition of a mixed crystal, it is preferable that x is equal to or above 0.1, in which case the $Al_xGa_{l-x}N$ intermediate layer 2 produces about the same effect as the aforementioned AlN intermediate layer. A GaN single crystal is grown on this intermediate layer 2 (FIG. 6B). FIG. 7 illustrates the schematic structure of a light-emitting device having the AlGaN intermediate layer. This light-emitting device comprises a Au-Sb electrode, a Si substrate, an AlGaN intermediate layer, an n type GaN single crystal layer, a p type GaN single crystal layer and a Au electrode, laminated one on another in the named order.

(iv) Use of Very Thin AlN Intermediate Layer

Figure 8A:
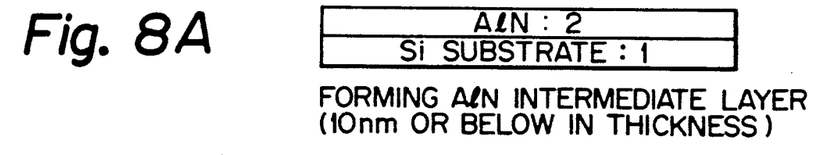
FIGS. 8A and 8B are schematic cross-sectional views showing individual layers on a Si substrate formed by a method of fabricating a gallium nitride type semiconductor device according to a still further example of the present invention.
Figure 8B:
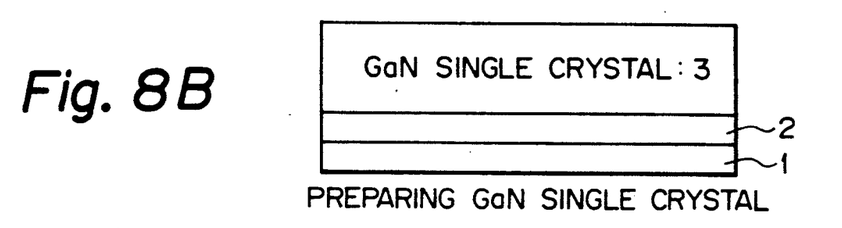
Figure 9:
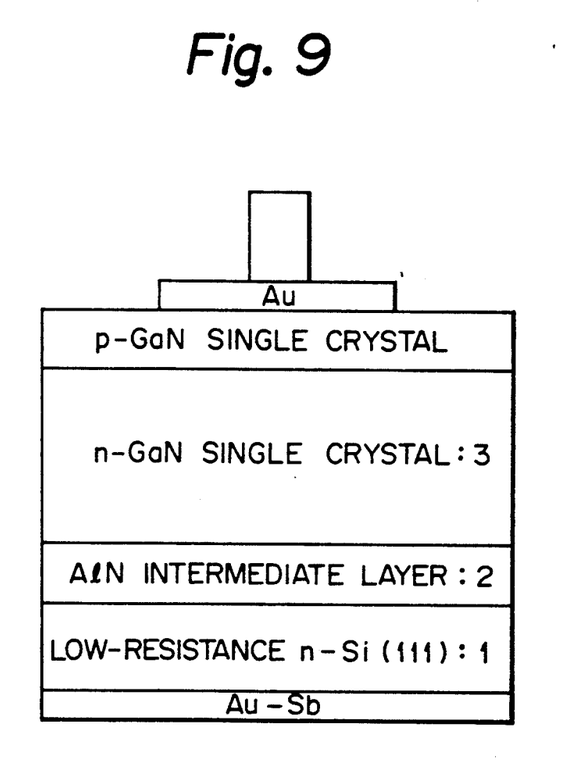
FIG. 9 is a schematic cross-sectional view illustrating the structure of a light-emitting diode as a gallium nitride type semiconductor device according to this example of the present invention.

As schematically illustrated in the growing process in FIGS. 8A and 8B, when the AlN intermediate layer 2 is formed to be a very thin film on the Si substrate 1 (FIG. 8A), the wave function of electrons in the Si substrate of a low-resistance n type, for example, overlaps the wave function of electrons in the n type GaN, causing the flow of a tunnel current, so that GaN is electrically connected to the Si substrate 1. To utilize this effect, the AlN intermediate layer 2 should be formed as thin as 10 nm or below, about the same degree as the broadening of the wave function, and it preferably has a thickness of 1 nm or more to effectively serve as an intermediate layer. In this method, the very thin film growing technique is used. A GaN single crystal is grown on this intermediate layer 2 (FIG. 8B). FIG. 9 illustrates the schematic structure of a light-emitting device having the very thin AlN intermediate layer. This light-emitting device comprises a Au-Sb electrode, a Si substrate, a very thin AlN intermediate layer, an n type GaN single crystal layer, a p type GaN single crystal layer and a Au electrode, laminated one on another in the named order.

The above completes the process of forming the intermediate layer.

(2) Formation of pn Junction

After the process for forming the intermediate layer, with the substrate temperature set to 1040° C., for example, a gallium-containing organic metal compound, e.g., trimethyl gallium (TMG), and $NH_3$ are supplied into the growth apparatus to grow a GaN layer as in the case of crystal growth on a sapphire substrate. In growing a mixed crystal, the necessary amounts of TMG, TMA and trimethyl indium (TMI) for a demanded composition of the mixed crystal are supplied.

After the thickness of the $(Ga_{1-x}Al_x)_{1-y}In_yN$ layer reaches the desired thickness, the supply of TMG, TMA and TMI is stopped and the temperature is lowered. After the substrate temperature becomes 600° C. or below, the supply of $NH_3$ is stopped. When the temperature lowers approximately to the room temperature, the resultant structure is taken out of the growth apparatus. The present invention provides the same advantages in growing the $(Ga_{1-x}Al_x)_{1-y}In_yN$ mixed crystal in almost all the compositions of the mixed crystal. It should however be noted that the advantages of the present invention cannot be expected in the case of growing AlN ($x=1$ and $y=0$) on the intermediate layer.

Since the $(Ga_{1-x}Al_x)_{1-y}In_yN$ crystal prepared in the above manner shows an n type conductivity without intentionally adding an impurity, it is used directly as an n type layer of the light-emitting device. Of course, an impurity serving as a donor may be intentionally added at the time of growing the aforementioned $(Ga_{1-x}Al_x)_{1-y}In_yN$ crystal. Next, the amount of the flow of the raw material gas is controlled in such a way that x and y in the entirety or part of the crystal surface take the desired values, while at the same time an impurity as an acceptor, e.g., the gas which is the raw material for zinc or magnesium, is supplied, thereby forming a junction of the $(Ga_{1-x}Al_x)_{1-y}In_yN$ crystal having different conductivities. After the growth is complete and the resultant wafer is taken out of the furnace, electrodes are formed on the individual layers having different conductivities, thus completing the fabrication of a light-emitting device.

Figure 10A:
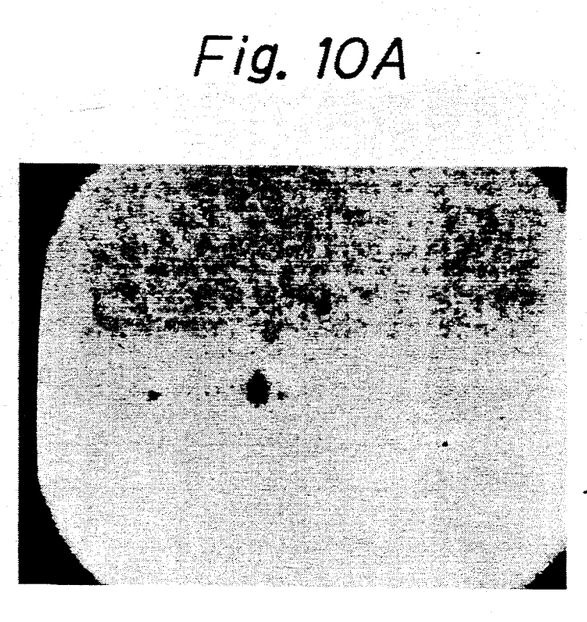
FIG. 10A is an enlarged plan view based on a microscopic photograph showing the surface of GaN formed by the present method of fabricating a gallium nitride type semiconductor device.
Figure 10B:
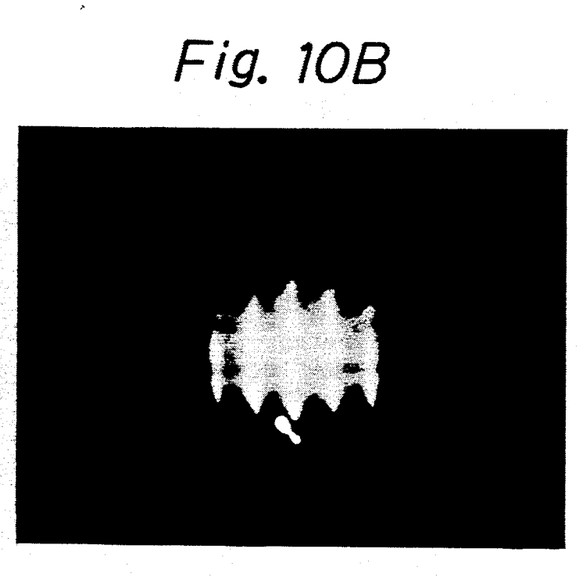
FIG. 10B shows a diffraction image of reflected electron beams.

FIG. 10A presents a microscopic photograph showing the surface of the GaN crystal grown on the AlN intermediate layer prepared by the present invention, and FIG. 10B shows a diffraction image of reflected electron beams.

Figure 11A:
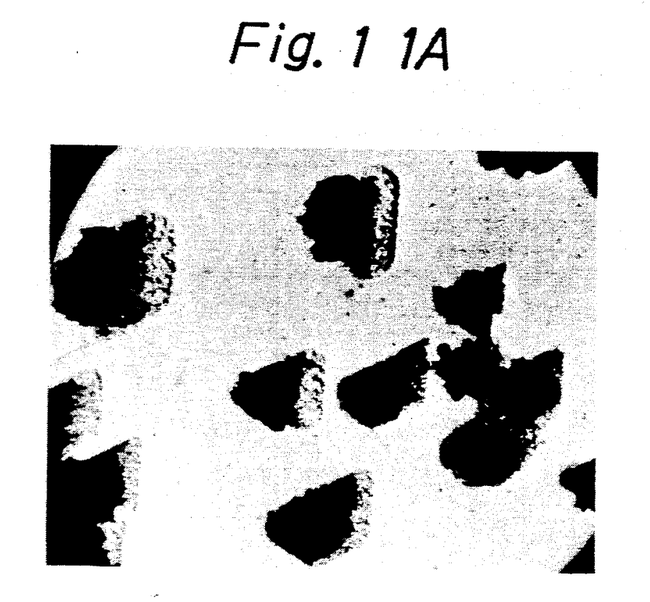
FIG. 11A is an enlarged plan view based on a microscopic photograph showing the surface of GaN according to a Comparative Example in the case where GaN is grown directly on a Si substrate.
Figure 11B:
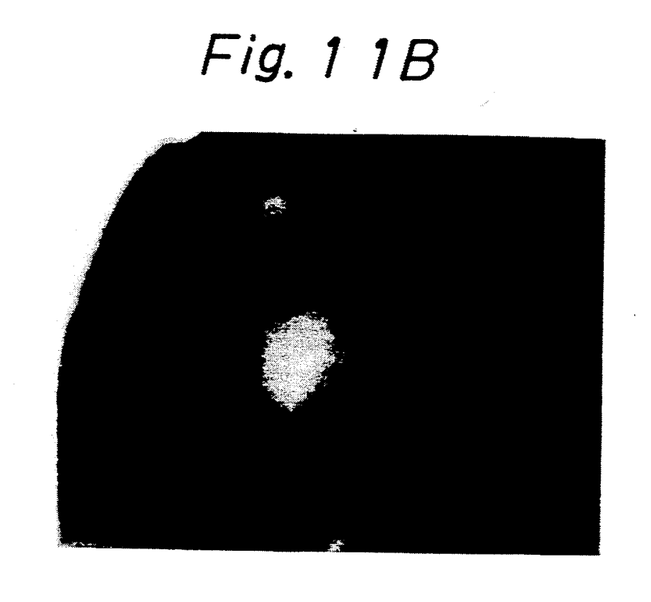
FIG. 11B shows a diffraction image of reflected electron beams.

FIG. 11A presents a microscopic photograph showing the surface of the GaN crystal directly on the Si substrate as a Comparative Example, and FIG. 11B shows a diffraction image of reflected electron beams. It is apparent from those photograph that the surface of the GaN crystal prepared using the AlN intermediate layer as in the present invention is significantly flat (FIG. 10A), while the diffraction image of reflected electron beams shows that the acquired GaN is a single crystal with excellent crystallinity as apparent from the Kikuchi lines and Kikuchi band observed in that image (FIG. 10B). With the GaN crystal directly grown on the Si substrate as in the Comparative Example, the crystal simply grows like islands (FIG. 11A), and no diffraction is observed (FIG. 11B), yielding considerably poor crystallinity.

The individual films were evaluated by a single crystal X-ray diffraction evaluating apparatus using the K$\alpha$ rays of copper as incident X rays. The GaN layer prepared by the present invention showed strong X-ray diffraction and clear separation of the K$\alpha_1$ rays and K$\alpha_2$ rays, and had crystallinity by no means inferior to the one grown on the sapphire substrate. The film directly formed on the Si substrate of the Comparative Example showed no X-ray diffraction, by which conclusion that this film has poor crystallinity was obtained.

As the present invention uses an inexpensive Si substrate, it will be the essential technology particularly in realizing the practical use of a device which emits and receives lights having wavelengths of a visible short wave range and an ultraviolet range.

As described above, a gallium nitride type semiconductor device embodying the present invention comprises a silicon substrate, an intermediate layer consisting of a compound containing at least aluminum and nitrogen and formed on the silicon substrate, and a crystal layer of $(Ga_{1-x}Al_x)_{1-y}In_yN$ ($0 \leq x \leq 1$, $0 \leq y = 1$, excluding the case of $x=1$ and $y=0$), so that this semiconductor device can operate even when a large current is supplied and also it can facilitate fine working, particularly, the formation of electrodes.

According to the present method of fabricating a gallium nitride type semiconductor device, a silicon single crystal substrate is kept at a temperature of 400 to 1300° C. and is held in the atmosphere where a metaloganic compound containing at least aluminum and a nitrogen-containing compound are present to form a thin film intermediate layer containing at least aluminum and nitrogen on a part or the entirety of the surface of the single crystal substrate, and then at least one layer or multiple layers of a single crystal of $(Ga_{1-x}Al_x)_{1-y}In_yN$ are formed on the intermediate layer. It is therefore possible to acquire a gallium nitride type semiconductor device that has a single crystal of $(Ga_{1-x}Al_x)_{1-y}In_yN$ which suppresses the occurrence of crystal defects of the acquired single crystal layer and thus has very high crystallinity and considerably excellent flatness.

What is claimed is:

1. A gallium nitride type semiconductor device comprising:
    a silicon (Si) substrate;
    an intermediate layer consisting of a compound containing at least aluminum and nitrogen formed on said silicon substrate; and
    a crystal layer of $(Ga_{1-x}Al_x)_{1-y}In_yN$ ($0 \leq x \leq 1$, $0 \leq y = 1$, excluding the case of $x=1$ and $y=0$) formed on said intermediate layer.

2. A gallium nitride type semiconductor device according to claim 1, wherein at least one other crystal layer of $(Ga_{1-x}Al_x)_{1-y}In_yN$ ($0 \leq x \leq 1$, $0 \leq y = 1$, excluding a case of $x=1$ and $y=0$) is formed on said crystal layer of $(Ga_{1-x}Al_x)_{1-y}In_yN$ ($0 \leq x \leq 1$, $0 \leq y = 1$, excluding the case of $x=1$ and $y=0$), the thus formed layer having different conductivity from that of said crystal layer and forming a pn junction, and x and y for each of the crystal layers are equal to each other or differ from each other.

* * * * *